United States Patent [19]

Gans et al.

[11] 4,434,405
[45] Feb. 28, 1984

[54] MULTIPLE AMPLIFIER INTERCONNECTION FOR OPTIMAL SENSITIVITY

[75] Inventors: Michael J. Gans, Monmouth Beach Township, Monmouth County; William W. Snell, Jr., Middletown Township, Monmouth County, both of N.J.

[73] Assignee: Bell Telephone Laboratories, Incorporated, Murray Hill, N.J.

[21] Appl. No.: 369,497

[22] Filed: Apr. 19, 1982

[51] Int. Cl.[3] .......................... H03F 1/26; H03F 3/68
[52] U.S. Cl. ................. 330/149; 330/124 R; 330/295
[58] Field of Search .............. 330/84, 149, 124 R, 330/295

[56] References Cited

U.S. PATENT DOCUMENTS

| | | | |
|---|---|---|---|
| 3,079,569 | 2/1963 | DeLoach, Jr. | 330/185 |
| 3,477,031 | 11/1969 | Nagata | 330/295 X |
| 4,156,859 | 5/1979 | Forward et al. | 333/213 |
| 4,180,786 | 12/1979 | Forward et al. | 333/32 |
| 4,198,612 | 4/1980 | Morton | 333/17 |
| 4,263,561 | 4/1981 | Weber | 330/149 |
| 4,264,871 | 4/1981 | Forward | 330/149 |

OTHER PUBLICATIONS

Chapman, "Noise Cancelling Preamp", *Elektor*, vol. 3, No. 7-8, Jul./Aug. 1977, p. 58.
Grocock, "Low-Noise Wideband Amplifier", *Wireless World*, Mar. 1975, pp. 117, 118.
Rothe et al., "Theory of Noisy Fourpoles", *Proceedings of the IRE*, vol. 44, No. 6, pp. 811–818.

*Primary Examiner*—James B. Mullins
*Attorney, Agent, or Firm*—John Francis Moran

[57] ABSTRACT

To obtain optimal operational sensitivity from an amplifier connected to a source of electrical signals, a technique utilizes multiple amplifiers connected together. The technique determines the number, N, of amplifiers (31 or 51) to be used and whether they should be connected in parallel (FIG. 3) or series (FIG. 5) in order to optimize the sensitivity of a given type of amplifier. Accordingly, multiple interconnection of amplifiers may be used in lieu of noise matching with transformers to minimize the excess-noise figure of the multiple amplifier circuit. The technique capitalizes on the advances in integrated circuit amplifier design, such as compactness and wideband performance, while providing lower loss and higher reliability through redundancy.

4 Claims, 6 Drawing Figures

MULTIPLE AMPLIFIER INTERCONNECTION FOR OPTIMAL SENSITIVITY

This invention relates to signal amplifiers and, more particularly, to techniques and circuit arrangements for improving the signal-to-noise performance of such amplifiers by employing multiple amplifying devices.

A well-known limitation on the operational sensitivity of amplifiers for low signal applications is their characteristic noise performance. The general approach for minimizing the effect of noise in applications involves matching the "noise impedance" of an amplifier to the output impedance of the signal source to obtain the maximum benefit from the input signal. This technique is commonly referred to as noise matching. Typically, practical applications dictate the value of the impedance, or resistance, of the signal source and the "noise resistance" of the amplifier should be matched thereto.

At low video frequencies, transformers may be used to provide the noise matching but they are usually bulky and likely to pick up noise. At higher frequencies, transformers tend to be lossy in addition to being bulky. Transmission line impedance transformers for operation at microwave frequencies are lossy and are unsuitable for applications requiring compact design. Since all transformers are somewhat frequency dependent, they tend to limit the useful bandwidth of the amplifiers in which they are used.

Other applications use so-called, simulated low-noise resistors for matching the "noise impedance" of an amplifier to the signal source. Although this eliminates the impedance matching transformer, such an approach introduces an additional noise source without a direct benefit in amplifier gain, i.e., that which is inherent in the amplifier of the simulated resistor. Futhermore, due to stability considerations of such simulators, there is only a limited range available for matching impedances.

A feature of inventive arrangement is that operational sensitivity is increased by circuit replication of amplifiers by capitalizing on the lower cost and miniaturization of amplifiers provided by advances in integrated circuit technology.

SUMMARY OF THE INVENTION

Broadly, the invention takes the form of a low noise amplifier circuit wherein a plurality of interconnected amplifiers without using matching hybrids, or transformers is able to provide increased operational sensitivity over that provided from a single amplifier.

In some of the aspects of the invention, a plurality of N like amplifiers are connected together to amplify electrical signals from a source having a predetermined source resistance $R_g$ and each amplifier includes a predetermined rms noise voltage source $E_R$ and predetermined rms noise current $I_R$. When $R_g$ is greater than $E_R/I_R$, a series interconnection on N amplifiers is used. The value of N is approximately equal to the quantity $(I_R R_g / E_R)$.

In some of the additional aspects of the invention, output means provides a common node output. This node is resistively coupled individually to each of the outputs of the plurality of N amplifiers whether the amplifiers are connected in series or parallel. In this type of connection, the inputs are connected serially to change the "noise impedance" of the circuit to improve the operational sensitivity. Typically, increased operational sensitivity is equivalent to minimization of the excess-noise figure of an amplifier.

BRIEF DESCRIPTION OF THE DRAWING

The above-mentioned and other features and objects of the present invention will become more apparent by reference to the following detailed description taken in conjunction with the accompanying drawing.

DETAILED DESCRIPTION

For purposes of the ensuing discussion, the noise performance of an amplifier is represented by an rms noise voltage source, $E_R$, and an rms noise current source $I_R$ present at the input of an amplifier. These noise sources may be correlated or uncorrelated with the latter thought to occur most frequently. Each source of electrical signals includes a source resistance $R_g$. The impedance relationship between the internal noise sources of the amplifier and the source resistance determines the lower limit on the operational sensitivity of an amplifier. Conventionally an impedance matching transformer couples a signal source to the amplifier and is used to increase the operational sensitivity of the amplifier by reducing its excess noise figure.

The total equivalent input noise voltage, $E_A$, of an amplifier is a function of the source resistance $R_g$. For example, in the case of a detector diode source, $R_g$ is the sum of two quantities. $R_s$ (the series spreading resistance) is the first quantity plus $R_B$ (the barrier resistance of an ideal diode). The equivalent input noise voltage may be expressed as:

$$E_A = \begin{cases} \sqrt{E_R^2 + I_R^2 R_g^2} \ ; E_R \text{ and } I_R \text{ uncorrelated,} \\ E_R + I_R R_g ; E_R \text{ and } I_R \text{ perfectly correlated,} \end{cases} \quad (1)$$

where $E_R$ and $I_R$ are rms equivalent noise voltage and current sources, respectively, reflected to the input and are approximately independent on the source resistance. When a transformer is used to match the source to the input of an amplifier, $E_A$ may be calculated with $$E_A = \sqrt{E_R^2 + \frac{I_R^2(R_B + R_S)^2}{n^4}}, \quad (2)$$

where n is the turns ratio of the transformer. The rms equivalent input noise is $$E'_A = nE_A = \quad (3)$$

$$\left\{ \begin{array}{l} \sqrt{[nE_R]^2 + \left[\dfrac{I_R R_g}{n}\right]^2} \quad ; E_R \text{ and } I_R \text{ uncorrelated,} \\[2ex] nE_R + \dfrac{I_R R_g}{n} \quad ; E_R \text{ and } I_R \text{ perfectly correlated.} \end{array} \right.$$

The value of n which minimizes $E'_A$ in Equation (3) is $$n_{opt} = \sqrt{\dfrac{I_R R_g}{E_R}} \; . \tag{3a}$$

For this optimum turns ratio the rms equivalent input noise is $$E'_A = \left\{ \begin{array}{l} \sqrt{2} \, \sqrt{E_R I_R R_g} \quad ; E_R \text{ and } I_R \text{ uncorrelated,} \\[1ex] 2\sqrt{E_R I_R R_g} \quad ; E_R \text{ and } I_R \text{ perfectly correlated.} \end{array} \right. \tag{3b}$$

In such a case the excess-noise figure, F-1, is found by $$F - 1 = \dfrac{(E'_A)^2}{4kTBR_g}, \tag{4}$$

where k is Boltzmann's constant, T is the temperature in degrees Kelvin, and B is the bandwidth measured in Hz. Thus, for each source resistance, $R_g$, minimizing the excess-noise figure is synonymous with minimizing $E'_A$.

Figure 1:
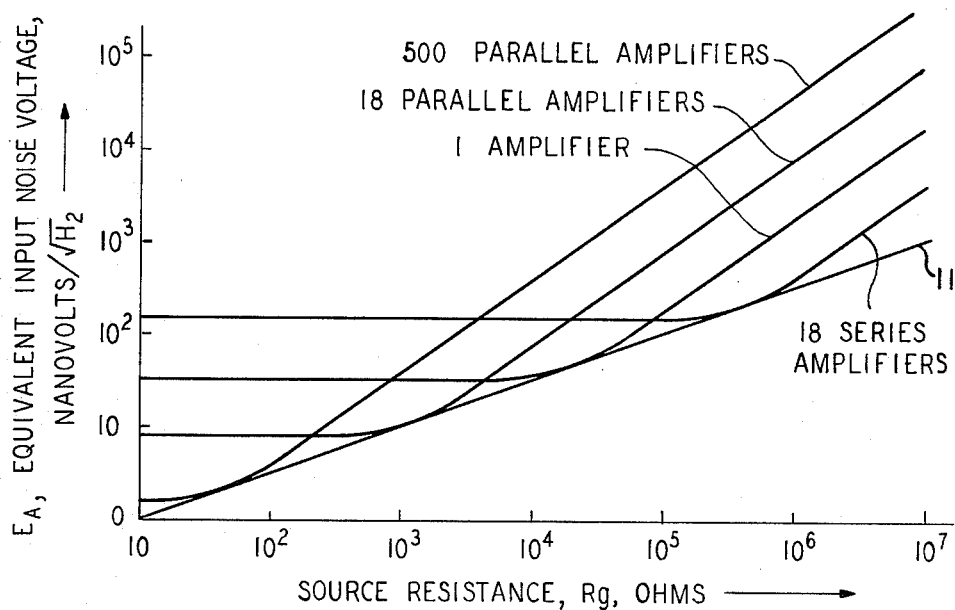
FIG. 1 is a graph illustrating optimal noise performance for various amplifier combinations wherein the noise current source and noise voltage source inherent to the amplifier are uncorrelated with each other.

FIG. 1 represents the impedance relationship between the input noise voltage $E'_A$ to the source resistance. The straight line 11 represents the optimum conventional arrangement wherein an idealized transformer having a continuously adjustable turns ratio provides optimum coupling between a given amplifier "noise impedance" and a range of impedances for the signal source. Of course, such a transformer does not exist or, at least would be difficult to realize in practical circuit arrangements. However, it does illustrate the optimum operational sensitivity which can be achieved from an amplifier by minimizing the effect of its equivalent input noise for various values of source resistance.

The curved lines or characteristics of amplifiers whose knees are tangential to line 11 represents various combinations of pluralities of amplifiers whose internal noise voltage source and noise current source are uncorrelated with each other. The noise voltage source, $E_R$, has a value of $35 nV/\sqrt{Hz}$ and noise current source, $I_R$, has a value of $1.75 pA/\sqrt{Hz}$. Accordingly, the selection of the appropriate number of amplifiers in either parallel or serial arrangements is able to obtain optimum operational sensitivity throughout a wide range of source resistance values.

Figure 2:
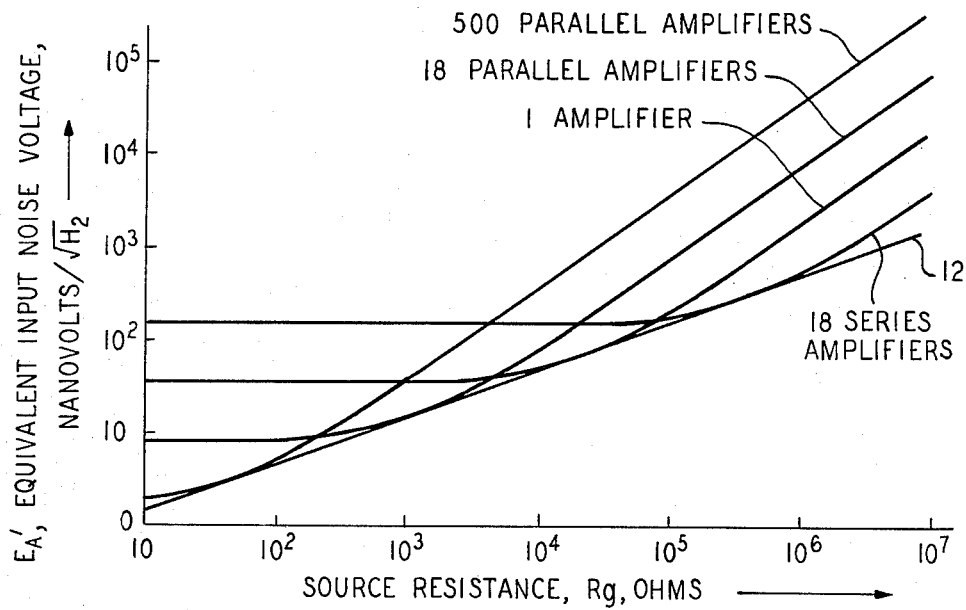
FIG. 2 is a similar chart to FIG. 1 wherein the noise voltage source and noise current source of the amplifiers used are perfectly correlated.

FIG. 2 illustrates a similar relationship wherein line 12 is the optimization line when the noise voltage source and noise current sources have the same values as in FIG. 1, but are perfectly correlated. In either case, connection of the appropriate number of amplifiers together whether in series or in parallel is able to achieve maximum operational sensitivity throughout a large range of values for the source resistance.

Figure 3:
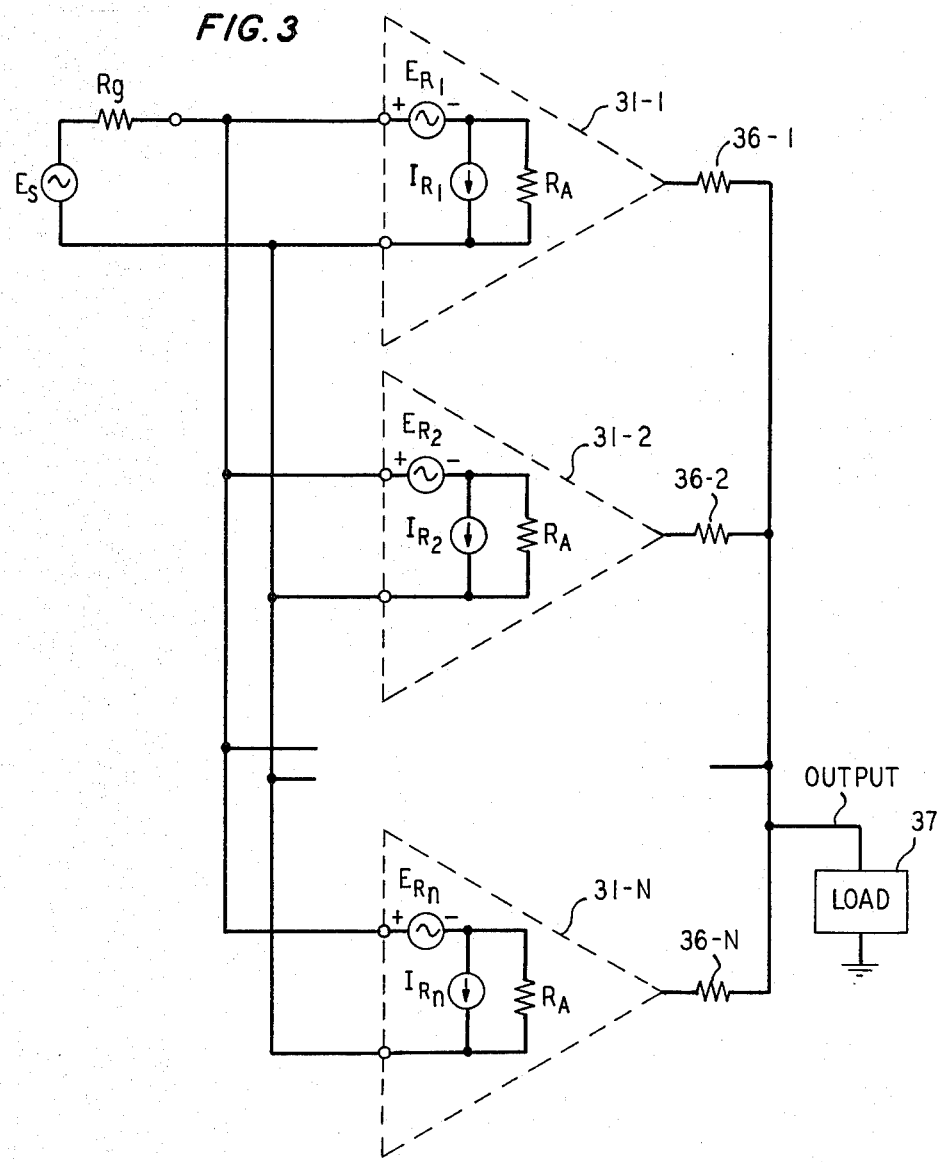
FIG. 3 illustrates the connection of a plurality of amplifiers with their inputs in parallel.

FIG. 3 is a circuit which provides parallel interconnection of a plurality of amplifiers 31-1 through 31-N, each of the amplifiers 31 being essentially identical to each other, the input of the amplifier circuit is driven by a voltage source $E_S$ having a source resistance $R_g$. Each amplifier contains an internal noise voltage source and noise current source connected to drive the input impedance of the amplifier $R_A$. The amplifier outputs are connected together in a star configuration by resistors 36-1 to 36-N, so that each amplifier contributes equally to drive load 37.

Figure 4:
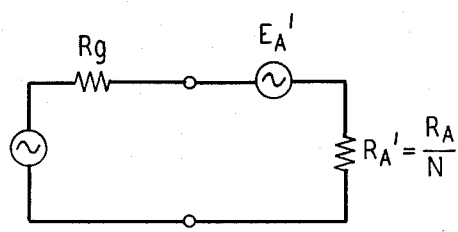
FIG. 4 depicts the equivalent impedance relationship produced by FIG. 3.

FIG. 4 is an equivalent circuit symbolically representing the impedance relationship present in FIG. 3. The combined effect of the parallel connection of amplifiers is represented by the serial connection of $E'_A$ and the reflected impedance $R'_A$ equal to $R_A/N$. Since $R_A$ is predetermined for a given type of amplifier, the value of $R'_A$ may be determined simply by paralleling the input of the appropriate number of individual amplifiers. Accordingly, the input impedance of the overall amplifier is reduced by dividing the individual input impedance of a single amplifier by the number of amplifiers connected in parallel. This arrangement is chosen when the source resistance $R_g$ is less than $E_R/I_R$. The number of amplifiers N is an integer in practice determined by $N = E_R/(I_R R_g)$.

Figure 5:
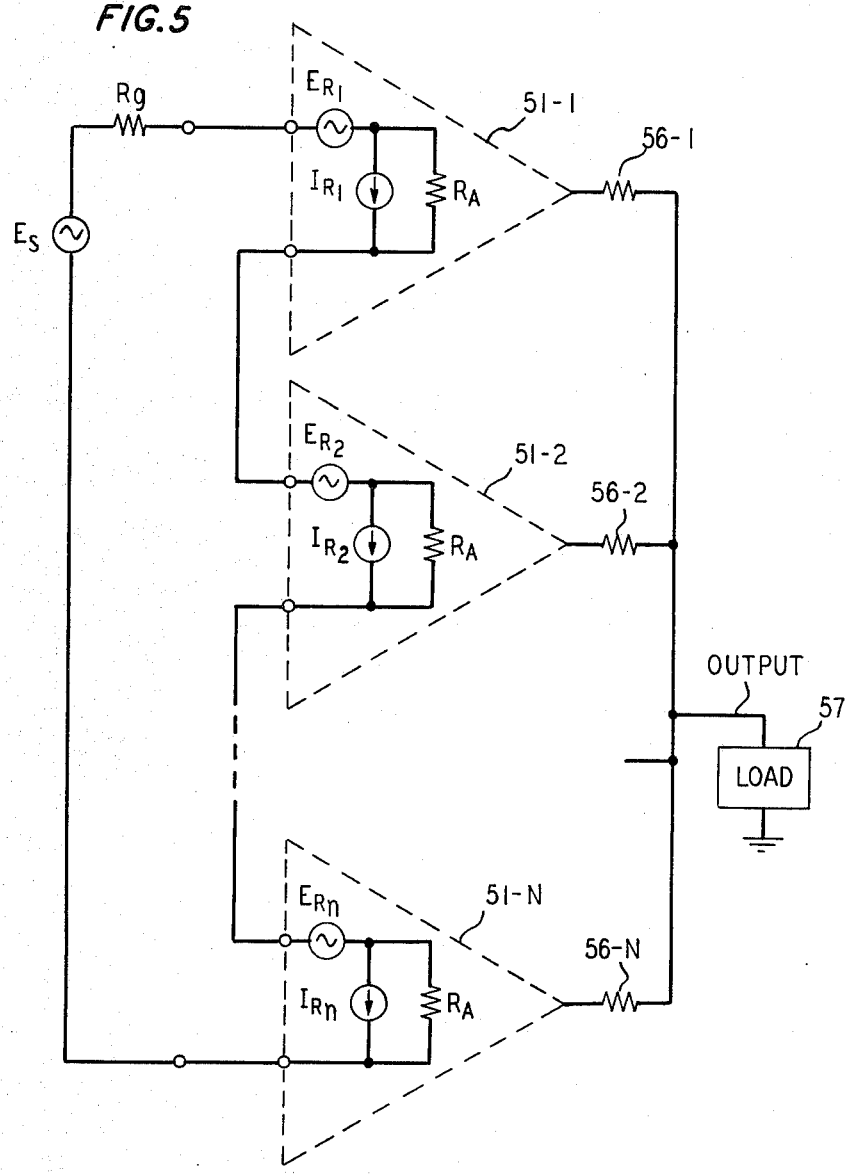
FIG. 5 depicts a plurality of amplifiers connected so that their inputs are serial.

FIG. 5 is a circuit diagram for connecting the input of N individual amplifiers together serially. Again, each of amplifiers 51-1 through 51-N are essentially identical to each other. The outputs of each of amplifiers 51 are again connected in star configuration to drive load 57 via individual resistors 56-1 through 56-N.

Figure 6:
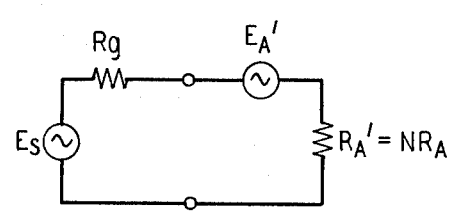
FIG. 6 is the equivalent circuit of the impedance relationship present in FIG. 5.

FIG. 6 is a circuit diagram depicting the equivalent impedance relationship represented by the serial connection on N amplifiers. In this arrangement, the equivalent input impedance $R'_A$ is the product of the number of amplifiers N times $R_A$. The serial interconnection is selected when $R_g$ is greater than $E_R/I_R$ where the number of amplifiers is determined by $N = (I_R R_g)/E_R$.

With respect to available integrated circuit amplifiers, multiple interconnection of such amplifiers in parallel or series will provide optimal operational sensitivity over a range of various source resistances. When bipolar integrated amplifiers are used which typically have a relatively low input "noise impedance", the inventive principles may be employed by connecting their inputs serially together. For field effect transistor amplifiers, including junction field effect transistors, whose input "noise impedance" is relatively high, parallel interconnection of a plurality of amplifier inputs in accordance with the inventive principles may be utilized for obtaining optimal operational sensitivity for source resistances that are low with respect to the input "noise impedance" of an individual amplifier. In other cases, the inventive technique may provide those in the art with the option of using the type of amplifier which is most advantageous in a particular application.

In all cases, it is to be understood that the embodiments described in the foregoing are merely illustrative of but a few of many possible specific embodiments which represent applications of the principles of the present invention. In a particular application, for example, it may be desirable to use both a series and parallel combination of amplifiers. Other methods of connecting the amplifier outputs can be used; e.g., multiport power combiners, or an array of hybrid couplers. Accordingly, numerous and varied other arrangements may be readily devised in accordance with these principles by those skilled in the art without departing from the spirit and scope of the invention.

What is claimed is:

1. A low noise circuit for providing amplified electrical signals comprising
   a source of electrical signals including a predetermined source resistance $R_g$
   characterized in that
   a plurality of N like amplifiers are connected together, each amplifier includes a predetermined rms noise voltage $E_R$ and a predetermined rms noise current $I_R$; and
   the plurality of N like amplifiers are connected in series, where N is substantially equal to the quantity $(I_R R_g)/E_R$, for $R_g$ greater than $E_R/I_R$.

2. A low noise circuit in accordance with claim 1 further comprising output means for providing a common output node, said output means resistively coupled individually to each of the outputs of the plurality of N amplifiers.

3. A low noise source for providing amplified electrical signals produced by a source of electrical signals including a predetermined source resistance $R_g$, the low noise circuit comprising:
   a plurality of N-like amplifiers, each amplifier including a predetermined rms noise voltage $E_R$ and a predetermined rms noise current $I_R$ wherein the plurality of N-like amplifiers have their inputs serially connected together when the value of $R_g$ is greater than $E_R/I_R$ and the value of N is approximately equal to the quantity of $(I_R R_g)/E_R$.

4. A low noise circuit according to claim 3 further comprising output means for providing a common output node, the output means comprising a plurality of N resistors each having one terminal connected to the node and the other terminal connected to the output of one of the N amplifiers.

* * * * *